(12) United States Patent
Chan et al.

(10) Patent No.: US 9,966,260 B1
(45) Date of Patent: May 8, 2018

(54) SURFACE MODIFICATION PROCESS FOR LASER APPLICATION

(71) Applicant: Apple Inc., Cupertino, CA (US)

(72) Inventors: Clayton Ka Tsun Chan, Fremont, CA (US); Ion Bita, Santa Clara, CA (US); Ranjith Samuel E. John, Fremont, CA (US); Alfred F. Renaldo, San Jose, CA (US); Jie Fu, San Jose, CA (US); Sudirukkuge T. Jinasundera, San Jose, CA (US); An-Chun Tien, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 15/232,738

(22) Filed: Aug. 9, 2016

Related U.S. Application Data

(63) Continuation of application No. 62/232,733, filed on Sep. 25, 2015.

(51) Int. Cl.
| | |
|---|---|
| *B32B 38/10* | (2006.01) |
| *H01L 21/033* | (2006.01) |
| *H01L 29/861* | (2006.01) |
| *H01L 29/66* | (2006.01) |
| *H01L 21/683* | (2006.01) |
| *H01L 21/268* | (2006.01) |
| *B29C 71/04* | (2006.01) |
| *B29D 11/00* | (2006.01) |

(52) U.S. Cl.
CPC .......... *H01L 21/0331* (2013.01); *B29C 71/04* (2013.01); *B29D 11/0073* (2013.01); *H01L 21/268* (2013.01); *H01L 21/6835* (2013.01); *H01L 29/66136* (2013.01); *H01L 29/861* (2013.01); *H01L 2221/6835* (2013.01); *H01L 2221/68381* (2013.01)

(58) Field of Classification Search
CPC . B32B 38/10; B32B 43/006; Y10T 156/1917; Y10T 156/1158; H01L 21/20; H01L 21/2011; H01L 21/2026; H01L 21/302; H01L 21/4829; H01L 21/7624; H01L 21/86
USPC .................................................. 156/712, 753
See application file for complete search history.

(56) References Cited

U.S. PATENT DOCUMENTS

| | | | |
|---|---|---|---|
| 6,949,395 B2 | 9/2005 | Yoo | |
| 8,455,913 B2 | 6/2013 | Epler et al. | |
| 2006/0091409 A1* | 5/2006 | Epler | H01L 33/0079 257/95 |
| 2008/0113460 A1* | 5/2008 | Shelton | H01L 33/0079 438/28 |
| 2008/0274574 A1* | 11/2008 | Yun | H01L 33/0075 438/47 |

(Continued)

FOREIGN PATENT DOCUMENTS

WO    WO 2009/035218 A2    3/2009

*Primary Examiner* — Mark A Osele
*Assistant Examiner* — Nickolas Harm
(74) *Attorney, Agent, or Firm* — Rutan & Tucker, LLP (57) ABSTRACT

Laser lift-off methods are described in which optical flatness is provided on the back side of a temporary substrate using either an optical layer or optical liquid. A laser is directed through the optical layer or optical liquid and a back side of the temporary substrate to decompose a portion of a process layer supported on a front side of the temporary substrate, followed by separation of the process layer and the temporary substrate.

25 Claims, 7 Drawing Sheets

(56) References Cited

U.S. PATENT DOCUMENTS

| | | | |
|---|---|---|---|
| 2009/0127575 A1* | 5/2009 | Horng | H01L 33/0079 |
| | | | 257/98 |
| 2010/0081256 A1 | 4/2010 | Uemura et al. | |
| 2011/0132549 A1* | 6/2011 | Sercel | B32B 38/0008 |
| | | | 156/712 |
| 2013/0126921 A1* | 5/2013 | Mohammed | H01L 33/0079 |
| | | | 257/98 |
| 2015/0207041 A1 | 7/2015 | Butterworth et al. | |
| 2015/0229108 A1* | 8/2015 | Steigerwald | H01S 5/4093 |
| | | | 372/45.01 |

* cited by examiner

SURFACE MODIFICATION PROCESS FOR LASER APPLICATION

RELATED APPLICATIONS

This application claims the benefit of priority of U.S. Provisional Application No. 62/232,733 filed Sep. 25, 2015, which is incorporated herein by reference.

BACKGROUND

Field

Embodiments described herein relate to semiconductor processing. More particularly, embodiments relate to laser lift-off techniques.

Background Information

Laser-lift off (LLO) techniques generally include directing a laser through a transparent substrate and decomposing a portion of an overlying layer, which can then be lifted-off of the transparent substrate. LLO is an enabling technology in a variety of applications. In one implementation, LLO is used during the fabrication of inorganic semiconductor-based light emitting diodes (LEDs). For example, a GaN (gallium nitride) based device layer may be grown on a sapphire growth substrate, and then removed from the sapphire growth substrate with a LLO technique. In another implementation LLO is used to delaminate polymer-based display backplanes from glass substrates during the fabrication of flexible displays.

SUMMARY

Embodiments describe laser lift-off methods. In an embodiment, a LLO method includes forming an optical layer on a back side of a temporary substrate that supports a process layer on a front side of the temporary substrate. The optical layer may be characterized by a front surface on the back side of the temporary substrate, an index of refraction within +/−0.25 of the temporary substrate at an operational wavelength, and a back surface. A laser at the operational wavelength is directed through the optical layer and the temporary substrate to decompose the process layer, followed by separating the process layer and the temporary substrate. Exemplary operational wavelengths may be within 190 to 400 nm, such as 248 nm and 308 nm. In an embodiment, the laser is operated at 10 to 300 Watts. In an embodiment, greater than 90% of photon energy from the laser is directed through the optical layer and the temporary substrate.

The back side of the temporary substrate may have an average surface roughness (Ra) that is greater than an average surface roughness of the back surface of the optical layer. In an embodiment, the back surface of the optical layer has an average surface roughness (Ra) of less than 5 nm. In an embodiment, the optical layer has an optical extinction coefficient (k) from 0 to 0.0005 at the operational wavelength.

LLO may be performed for a variety of substrate stacks. For example, the process layer may be an epitaxially grown layer, such as an epitaxially grown layer including a p-n diode. In an embodiment, the temporary substrate is a single side polished (SSP) wafer, such as a SSP GaN (gallium nitride) wafer. Following LLO, the temporary substrate may be reclaimed for reuse.

In an embodiment, a LLO method includes immersing a substrate stack in an optical liquid. The substrate stack may include a temporary substrate that supports a process layer on a front side of the temporary substrate. In an embodiment, the optical liquid has an index of refraction within +/−0.25 of an index of refraction of the temporary substrate at an operational wavelength. A laser at the operational wavelength is directed through the optical liquid and the temporary substrate to decompose the process layer, followed by separating the process layer and the temporary substrate. Exemplary operational wavelengths may be within 190 to 400 nm, such as 248 nm. In an embodiment, the laser is operated at 10 to 300 Watts. In an embodiment, greater than 90% of photon energy from the laser is directed through the optical fluid and the temporary substrate.

In an embodiment, the back side of the temporary substrate has an unpolished back side. For example, the temporary substrate may be a SSP wafer, such as a SSP GaN wafer. LLO may be performed for a variety of substrate stacks. For example, the process layer may be an epitaxially grown layer, such as an epitaxially grown layer including a p-n diode. Following LLO, the temporary substrate may be reclaimed for reuse.

DETAILED DESCRIPTION

Embodiments describe laser lift-off (LLO) procedures to separate a temporary substrate (e.g. sapphire growth substrate) from a process layer (e.g. grown device layer). In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment.

Furthermore, the particular features, structures, configurations, or characteristics may be combined in any suitable manner in one or more embodiments.

The terms "front", "back", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe LLO methods in which optical flatness is provided on the back side of a temporary substrate using either an optical layer or optical liquid. For various reasons a process layer (e.g. device layer) may be formed on a single side polished (SSP) temporary substrate (e.g. growth substrate, wafer). For example, a temporary substrate with a non-polished back side may be easier to handle with existing semiconductor processing equipment compared to a temporary substrate with a polished back side.

It has been observed that directing a laser through a non-polished, rough, back side of the temporary substrate during a LLO operation may result in an unacceptable amount of reflection of the incident laser at the back side. As a result, less laser energy is transmitted to the target LLO location within the substrate stack. One solution is to lap and polish the back side of the temporary substrate after formation of the process layer to achieve a high degree of smoothness. However, lapping and polishing may take a considerable amount of time. Lapping and polishing may also render the temporary substrate so that it is not reusable, for example, to due to a newly polished back side surface or reduction in thickness. Another solution may be to increase the laser power. However, increased laser power may result in the creation of additional defects in the process layer, which can potentially lead to cracking or delamination. The creation of defects may be particularly applicable to heteroepitaxially grown device layers on growth substrates, such as, but not limited to, epitaxially grown GaN on a sapphire growth substrate.

In one embodiment, a LLO method includes forming an optical layer on a back side of a temporary substrate (e.g. growth substrate) that supports a process layer (e.g. device layer) on a front side of the growth substrate. The optical layer may be characterized by a front surface on the back side of the temporary substrate, an index of refraction (n) within +/-0.25 of the temporary substrate for the LLO operational wavelength (e.g. 248 nm) of the laser, and a back surface with an average surface roughness (Ra) of less than 5 nm. In an embodiment, the optical layer has an optical extinction coefficient (k) from 0 to 0.0005 for the LLO operational wavelength (e.g. 248 nm) of the laser. Optical extinction coefficient (k) may be dependent upon thickness of the optical layer. In an embodiment, the optical layer has a thickness of approximately 1-5 μm, such as approximately 1 μm, though any suitable thickness may be chosen, particularly if (k) is within 0 to 0.0005. A laser at the operational wavelength is then directed though the optical layer and the temporary substrate, and focused on the process layer. For an exemplary system including a GaN device layer grown on a sapphire growth substrate, the laser energy decomposes the GaN at the interface with the sapphire growth substrate into metallic gallium and gaseous nitrogen. The epitaxially grown layer and growth substrate may then be separated, for example, after heating the substrate stack to liquefy the metallic gallium.

In another embodiment, a LLO method includes immersing a substrate stack in an optical liquid that is characterized by an index of refraction (n) within 0.25 of the temporary substrate for the LLO operational wavelength (e.g. 248 nm) of the laser. In an embodiment, the optical liquid between the laser and the back side of the temporary substrate (e.g. depth of immersion) has an optical extinction coefficient (k) from 0 to 0.0005 for the LLO operational wavelength (e.g. 248 nm) of the laser. A laser at the operational wavelength is then directed though the optical liquid and the temporary substrate (e.g. growth substrate), and focused on the process layer (e.g. device layer) to decompose the process layer. For an exemplary system including a GaN device layer grown on a sapphire growth substrate, the laser energy decomposes the GaN at the interface with the sapphire growth substrate into metallic gallium and gaseous nitrogen. The epitaxially grown layer and growth substrate may then be separated, for example, after heating the substrate stack to liquefy the metallic gallium.

In accordance with embodiments, laser transmission during LLO through the optical layer and temporary substrate, or through the optical fluid and temporary substrate may be greater than 80% of photon energy, or more specifically greater than 90% of photon energy. Transmission loss can be attributed to several factors including (1) reflection/scattering loss at the interface between the optical coating/liquid and air, (2) internal absorption of the optical coating/liquid attributed to the optical extinction coefficient (k) of the optical coating/liquid, (3) reflection/scattering loss at the interface between the optical coating/liquid and the back side of the temporary substrate, and (4) reflection loss at the front side of the temporary substrate. Transmission loss at (1) the interface between the optical coating/liquid and air is dependent upon the optical coating/liquid surface finish quality (e.g. Ra). Transmission loss due to (2) internal absorption of the optical coating/liquid depends upon the material forming the optical coating/liquid. Transmission loss due to (3) reflection/scattering loss at the interface between the optical coating/liquid and the back side of the temporary substrate depends upon the refractive index (n) difference between the optical coating/liquid and the temporary substrate, where closely matched refractive indices may mitigate the amount of photon energy that is sent off course to the active area of interest.

Figure 1:
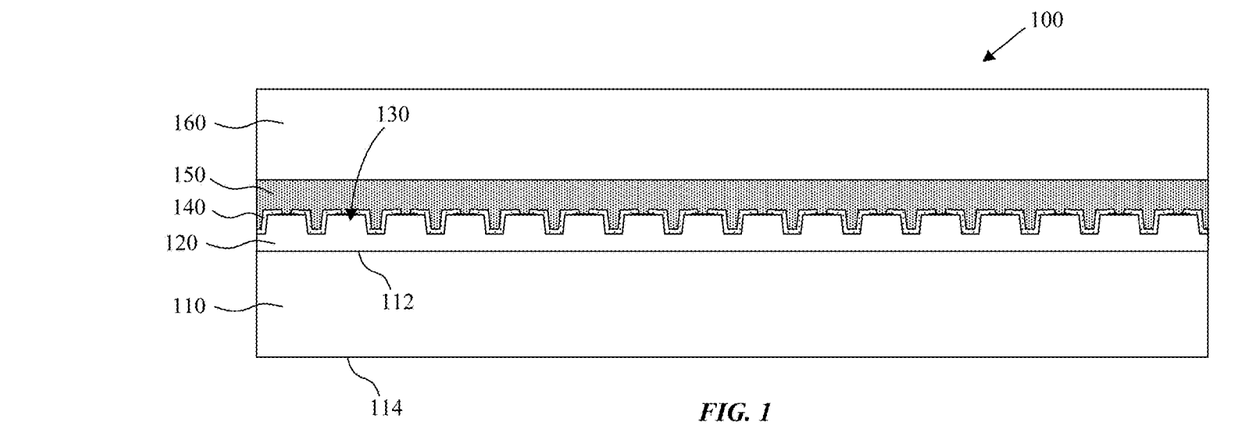
FIGS. 1-2 are cross-sectional side view illustrations of substrate stacks in accordance with embodiments.

FIG. 1 is a cross-sectional side view illustration of a substrate stack in accordance with an embodiment. As illustrated, the substrate stack 100 includes a temporary substrate 110 and a process layer 120. In the particular embodiment illustrated in FIG. 1, process layer 120 may be a heteroepitaxially grown device layer. For example, process layer 120 may include one or more epitaxially grown III-V or II-VI semiconductor layers. In an embodiment, process layer 120 is an epitaxailly grown LED device layer, and the temporary substrate 110 is a sapphire growth substrate, or wafer. For example, the LED device layer may include one or more layers based on the GaN (gallium nitride) III-V system. In addition to, or in alternative to, the LED device layer may include one or more layers such as InGaN (indium gallium nitride), AlN (aluminum nitride), and AlGaN (aluminum gallium nitride). In the particular embodiment illustrated, the LED device layer may include multiple layers including a p-doped semiconductor layer, an n-doped semiconductor layer, and one or more active layers (e.g. quantum well layers) between the p-doped semiconductor layer and the n-doped semiconductor layer. Additional layers may be included within the LED device layer. In an embodiment, the process layer 120 is on a front side 112 of the temporary substrate. For example, an epitaxially grown GaN device layer may be formed on a polished front side 112 of a sapphire growth substrate. The back side 114 of the sapphire growth substrate is non-polished in an embodiment.

In the particular embodiment illustrated in FIG. 1, the process layer 120 (e.g. LED device layer) may be patterned to include an array of mesa structures 130. Each mesa structure 130 may include a p-n diode including a p-doped layer, an n-doped layer, and one or more active layers (e.g. quantum well layers) between the p-doped layer and the n-doped layer. A patterned sacrificial layer 140, such as silicon oxide or silicon nitride may be formed over the patterned process layer 120. A bonding layer 150 is formed over the process layer 120, and optional sacrificial layer 140 to bond the structure to a carrier substrate 160. In an embodiment, the bonding layer is formed of a thermoset material such as epoxy or benzocyclobutene (BCB). In an embodiment, the carrier substrate 160 is a suitable to supports subsequent manufacturing processes. For example, carrier substrate may be a glass panel, or silicon wafer.

Figure 2:
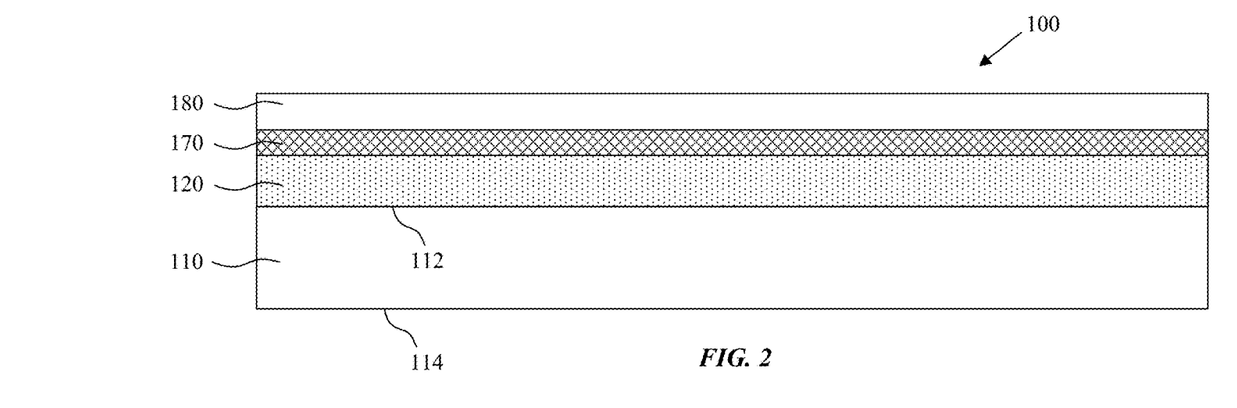

While embodiments may be particularly applicable to heteroepitaxial systems, embodiments are not so limited and may be used to facilitate LLO for a variety of systems. In addition to heteroepitaxial systems, embodiments may be utilized for LLO of homoepitaxial systems. Embodiments are not limited to epitaxial systems. Embodiments may be utilized to facilitate substrate-to-substrate (e.g. wafer-to-wafer) film transfer including the transfer of thin films including LEDs, functional devices, and integrated circuits. Embodiments may additionally be used during the fabrication of flexible displays. FIG. 2 is a cross-sectional side view illustration of a substrate stack in accordance with an embodiment. For example, the substrate stack 100 illustrated in FIG. 2 may be used during the fabrication of a flexible display. As illustrated, the substrate stack 100 includes a temporary substrate 110 and a process layer 120. In the particular embodiment illustrated in FIG. 2, process layer 120 may be a polymer film. For example, the process layer 120 may be a flexible film (e.g. polyimide) that supports a thin film transistor (TFT) layer 170. Process layer 120 may have a suitable thickness to achieve a suitable flexibility. A top encapsulation layer 180 may be provided over the process layer 120. For example, encapsulation layer 180 may include a transparent material. In accordance with embodiments, the temporary substrate 110 supporting the process layer 120 may be a variety of materials, including wafer and glass panels. In an embodiment, the process layer 120 is on a front side 112 of the temporary substrate. For example, a polyimide polymer layer may be formed on a front side 112 of a glass panel, which may optionally be polished. In an embodiment, the back side 114 of the glass panel is non-polished, rough.

Figure 3:
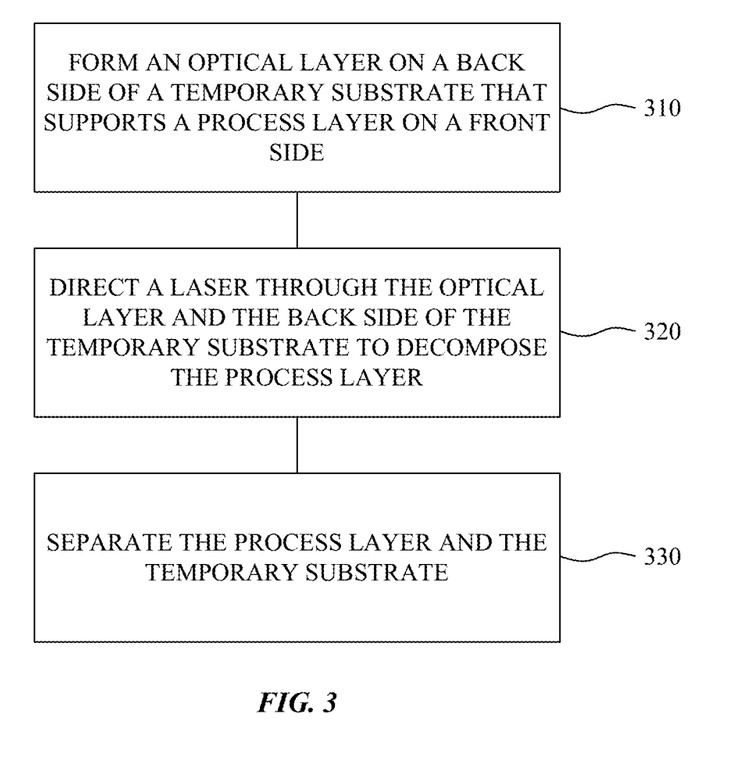
FIG. 3 is a flow chart illustrating a LLO process with an optical layer in accordance with an embodiment.
Figure 4:
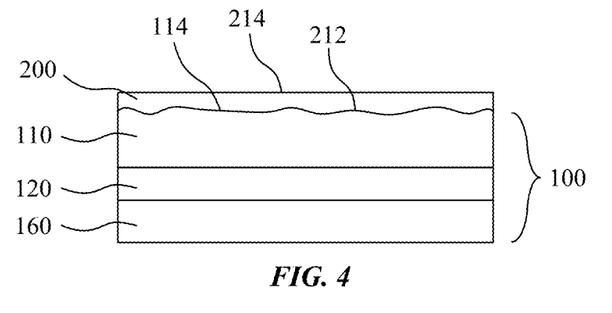
FIGS. 4-6 are schematic cross-sectional side view illustrations of a LLO process with an optical layer in accordance with an embodiment.
Figure 5:
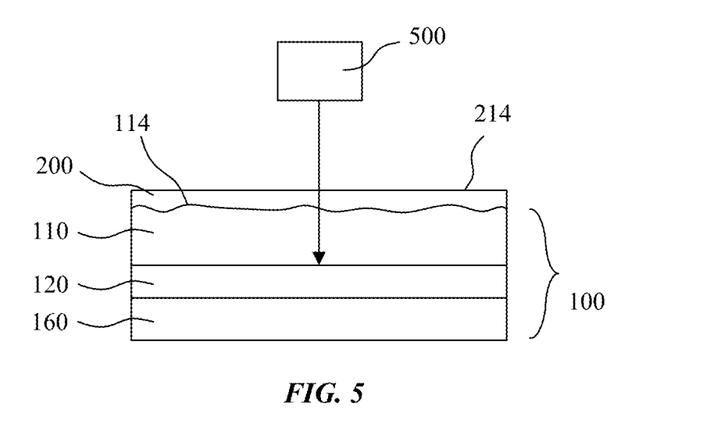
Figure 6:
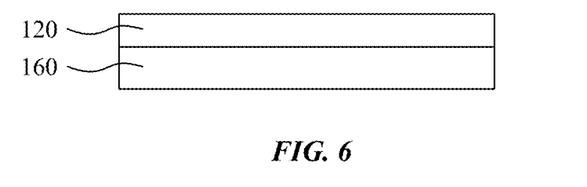

FIG. 3 is a flow chart illustrating a LLO process with an optical layer in accordance with an embodiment. FIGS. 4-6 are schematic cross-sectional side view illustrations of a LLO process with an optical layer in accordance with an embodiment. In interest of clarity, description of the procedure in FIG. 3 is made with regard to the features provided in FIGS. 4-6. At operation 310 an optical layer 200 is formed on a back side 114 of a temporary substrate 110 supports a process layer 120 on a front side 112. The temporary substrate 110 and process layer 120 may be a portion of a variety of substrate stacks 100 including, but not limited to, those described above with regard to FIGS. 1-2. The particular process flow illustrated in FIGS. 4-6 is made with regard to the substrate stack 100 illustrated in FIG. 1. However, this is meant to be exemplary, and a variety of substrate stacks 100 may be used in the process flow illustrated in FIGS. 4-6, including the substrate stack 100 illustrated in FIG. 2.

Referring now to FIG. 4, the optical layer 200 includes a back surface 214, and a front surface 212 on the back side 114 of the temporary substrate 110. For example, the front surface 212 may be formed directly on the back side 114 of the temporary substrate 110. In an embodiment, the back side 114 of the temporary substrate 110 has an average surface roughness (Ra) that is greater than an average surface roughness (Ra) of the back surface 214 of the optical layer 200. In this manner, the optical layer 200 may create an optical flatness that reduces laser light reflection at the back side 114 of the temporary substrate 110, and increases laser fluence to the target location. In an embodiment, the back surface 214 of the optical layer 200 has an average surface roughness (Ra) of less than 5 nm. The average surface roughness (Ra) may hold true at all locations across the optical layer 200. In an embodiment, a measured average surface roughness (Ra) value is averaged across five locations across the optical layer 200, at a center and 10 mm from the edge of the substrate stack at 12, 3, 6, and 9 o'clock. In an embodiment, the optical layer 200 is formed of a material with a refractive index (n) within +/−0.25 of a material from which the temporary substrate 110 is formed. For example, an optical layer 200 may have a refractive index of 1.57-2.08 at 248 nm when formed on sapphire growth substrate with a refractive index of 1.83 at 248 nm. Refractive index may vary dependent upon wavelength. For example, sapphire is reported to have an index of refraction of 1.93 at 193 nm, 1.81 at 308 nm, and 1.75 at 1320 nm. In an embodiment, the optical layer 200 has an optical extinction coefficient (k) from 0 to 0.0005 for the LLO operational wavelength (e.g. 248 nm) of the laser. Optical extinction coefficient (k) may be dependent upon thickness of the optical layer 200. In an embodiment, the optical layer 200 has a thickness of approximately 1-5 µm, such as approximately 1 µm, though any suitable thickness may be chosen, particularly if (k) is within 0 to 0.0005.

Following the formation of the optical layer 200, as illustrated in FIG. 5 at operation 320 a laser from laser source 500 is directed through the optical layer 200 and the back side 114 of the temporary substrate 110 to decompose a portion of the process layer 120. In accordance with embodiments, exemplary LLO laser operating conditions may be from 190-400 nm wavelength and 10-300 Watts average power. More specifically, exemplary LLO laser operating conditions may include a KrF excimer laser, 248 nm wavelength, 100-150 Watts average power. However, the laser conditions are exemplary and embodiments are not limited to excimer lasers, specific laser wavelengths, or power ranges. The process layer 120 and the temporary substrate 110 may then be separated at operation 330 as illustrated in FIG. 6.

Figure 7:
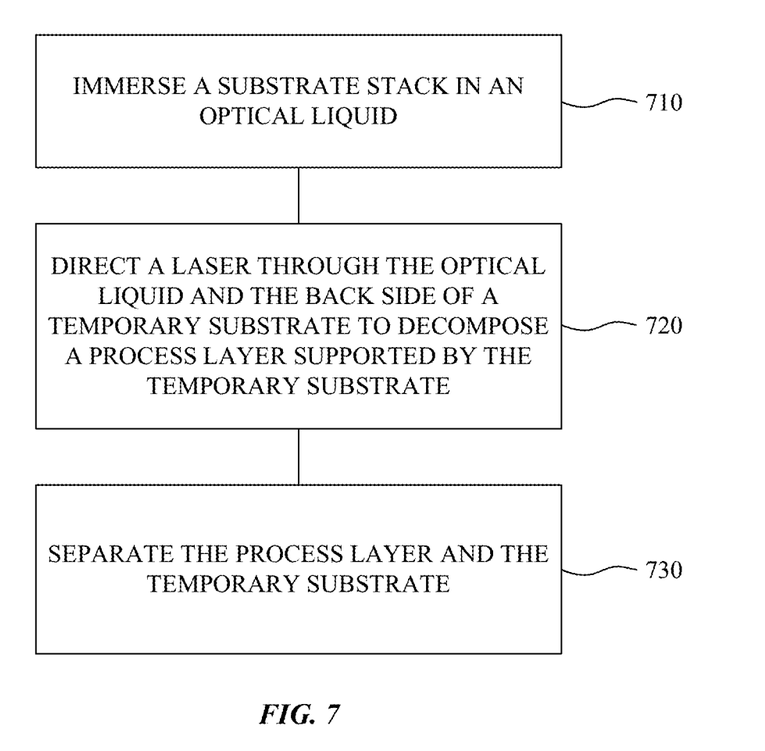
FIG. 7 is a flow chart illustrating a LLO process with an optical liquid in accordance with an embodiment.
Figure 8:
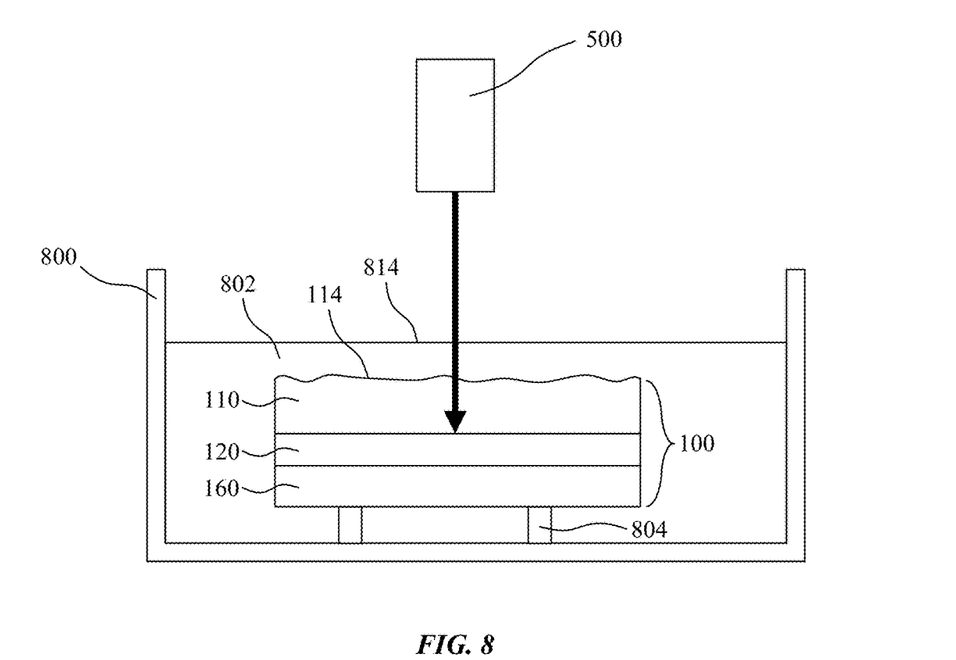
FIG. 8 is a schematic cross-sectional side view illustration of a substrate stack immersed in an optical liquid in accordance with an embodiment.

Referring now FIG. 7 a flow chart is provided illustrating a LLO process with an optical liquid in accordance with an embodiment. FIG. 8 is a schematic cross-sectional side view illustration of a substrate stack immersed in an optical liquid in accordance with an embodiment. As illustrated in FIGS. 7-8, at operation 710 a substrate stack 100 is immersed in an optical liquid 802. The back side 114 of the temporary substrate may be immersed a distance (d) from the top surface 814 of the optical liquid 802. The substrate stack 100 may be a variety of substrate stacks 100 including, but not limited to, those described above with regard to FIGS. 1-2. As shown in FIG. 8, the optical liquid 802 may be stored within container 800, and the substrate stack 100 supported by pins 804. In an embodiment, the optical layer liquid 802 is formed of a material with a refractive index (n) within +/−0.25 of a material from which the temporary substrate 110 is formed. In an embodiment, the optical fluid has an optical extinction coefficient (k) from 0 to 0.0005 over the immersion distance (d) for the LLO operational wavelength (e.g. 248 nm) of the laser.

At operation 720 a laser from laser source 500 is directed through the optical liquid 802 and the back side 114 of the temporary substrate 110 to decompose a portion of the process layer 120. In accordance with embodiments, exemplary LLO laser operating conditions may be from 190-400 nm wavelength and 10-300 Watts average power. More specifically, exemplary LLO laser operating conditions may include a KrF excimer laser, 248 nm wavelength, 100-150 Watts average power. However, the laser conditions are exemplary and embodiments are not limited to excimer lasers, specific laser wavelengths, or power ranges. The process layer 120 and the temporary substrate 110 may then be separated at operation 730.

In accordance with embodiments, an optical layer 200 or optical liquid 802 is used in order to increase laser transmission through the temporary substrate. The optical layer/liquid may be in various material states including solids, liquids, gels, dispersions possessing a refractive index within +/−0.25 of the temporary substrate may additionally be substantially transparent at the specific laser wavelength, e.g. 248 nm, with an optical extinction coefficient (k) from 0 to 0.0005. In accordance with embodiments the back side of the temporary substrate 110 may be optically smoothed by the application of an optical layer 200 or submersion in an optical liquid 802. In accordance with embodiments, the optical layer 200 or optical liquid 802 may be formed of materials such as an organic or inorganic polymer, or nanoparticles as part of a film or free-standing liquid coating. The optical layer 200 may be formed using a variety of techniques including spin coating, slit coating, spray coating, and molding. The selection of materials for the optical layer/fluid meeting the criteria for (n) and (k) includes, but is not limited to, small molecules or polymers.

In an embodiment, the optical layer 200 may be a gel. Gels are solventless, and upon curing form soft protective coatings for substrates. They may possess both the self-healing property of liquids while having the structural integrity of elastomeric materials. Depending on the viscosity gels can be coated via spin coating, spray coating, dip coating and molding. During the coating of gels via spin coating or spray coating the gel first conforms to the surface of the temporary substrate but after a brief hold period for a couple of minutes due to the self healing/self leveling property of gels they form a front surface with the specified average roughness. In cases where the viscosity of the gels is too high for spin coating or spray coating, dip coating and molding is used for the achieving a front surface with the specified average surface roughness. In dip coating the substrate stack to be coated is inserted vertically into a gel coat bath and slowly pulled out and based up on the speed it is inserted and pulled the thickness of the coating varies. Upon coating the substrate stack is allowed to stay undisturbed during which the gel surface planarizes to the specified average surface roughness. The final coating or surface finish method using gels is to simply place the substrate stack to be coated in a mold which has a finish of desired average surface roughness and filling the mold with the gel. The mold is then heated to above the curing temperature upon which the substrate stack is encapsulated with the gel with an average surface roughness of that of the mold.

In an embodiment, the optical layer 200 or optical liquid 802 is a dispersion of nanoparticles in an organic medium or aqueous solution. The nanoparticles can be inorganic fillers in nano-sized particles dispersed within a carrier system (e.g. organic or aqueous medium). A uniform dispersion may be created, for example, through treatment of a suspension of combined materials with a sonication bath using ultrasonic waves. The optical layer/fluid in accordance with embodiments may include an organic material or water. In an embodiment, metal or metal oxide particles such as titanium oxide, zinc sulfide, and zinc telluride having a refractive index (n) in the rage of 2.4-3.5 are included. In accordance with embodiments, inorganic-organic hybrid composites (e.g. dispersions) of metals may be utilized to match a specified refractive index (n), and exhibit optical properties with a low optical extinction coefficient (k). For example, the Rayleigh Scattering Equation may be utilized to determine parameters for optical transparency such as particle size and radiation wavelength. High transparent dispersion formulations may include particle diameter size of approximately ¹/₁₀ the wavelength of radiation. In an embodiment, particle diameter of less than 25 nm may be utilized with a 248 nm operational laser wavelength.

One class of organic materials includes non-polar compounds such as saturated hydrocarbons lacking functional groups that have absorbance near the operational laser wavelength, e.g. 248 nm. Functional groups within organic molecules can strongly absorb light depending upon their structure. One absorption parameter is lambda max, the wavelength (nm) within a UV spectrum where the absorbance is at a maximum, and a second absorption parameter is molecular absorption coefficient (usually in unit of L mol-1 cm-1). Typically the higher the molecular absorption coefficient value the greater the absorbance at the maximum wavelength. In an embodiment, the material forming the optical layer/liquid does not include a functional group having absorbance near or at the LLO operational wavelength (e.g. 248 nm). For example, the following functional groups may not be included in an optical layer/liquid in accordance with embodiments: carbonyl, ethylene, conjugated double bonds, thiol, thiocarbonyl, thioether, unsaturated ketone, benzene or substituted aromatic compounds.

Exemplary functional groups with low molecular absorption coefficient values at 248 nm, that may be included within an optical layer/liquid in accordance with embodiments include: sufone, halogens such as iodide, and bromide. Refractive index (n) depends upon the polarizability and density of a molecule. The greater the polarizability of a molecule usually the larger the induced dipole. Polarizable molecules tend to decrease the speed of light passing through the molecule. Index of refraction describes the change in the speed of light into a medium. Density is also a parameter impacting refractive index. Higher density increases refractive index. Examples of molecules that can increase (n) include: bromides, iodides, chlorides, sulfones, linear and cyclic sulfur structures. Cyclic and linear hydrocarbons show an increase in refractive index as a function of number of carbons and number of acyclic rings translating into increased density.

In accordance with embodiments, exemplary materials that may be used to form the optical layers/liquid include, but are not limited to, linear alkanes, cyclic alkanes, and complex cycloalkanes such as 3-methylpentane, 2,2-dimethylbutane, 2,3-dimethylbutane, 2-methylpentane, hexadecane, tetradecane, dodecane, decane, n-octylcyclohexane, cyclohexane, cyclopentane, cycloheptane, cyloooctane, octahydroindene, 2-ethylnorbornane, 1,1'-bicyclohexyl, exo-tetrahydrodicyclopentadiene, decahydronphthalene, trans-decahydronaphthalene, cis-decahydronphthalene, and perhydropyrene. In accordance with embodiments, the optical layer/liquid may include bromides, iodides, chlorides, sulfones, linear and cyclic sulfur structures. In an embodiment, the optical layer/liquid may include cyclic or linear hydrocarbons further including bromides, iodides, chlorides, sulfones, linear and cyclic sulfur structures. Exemplary materials may additionally include metal functionalized organic or inorganic polymers.

Figure 9:
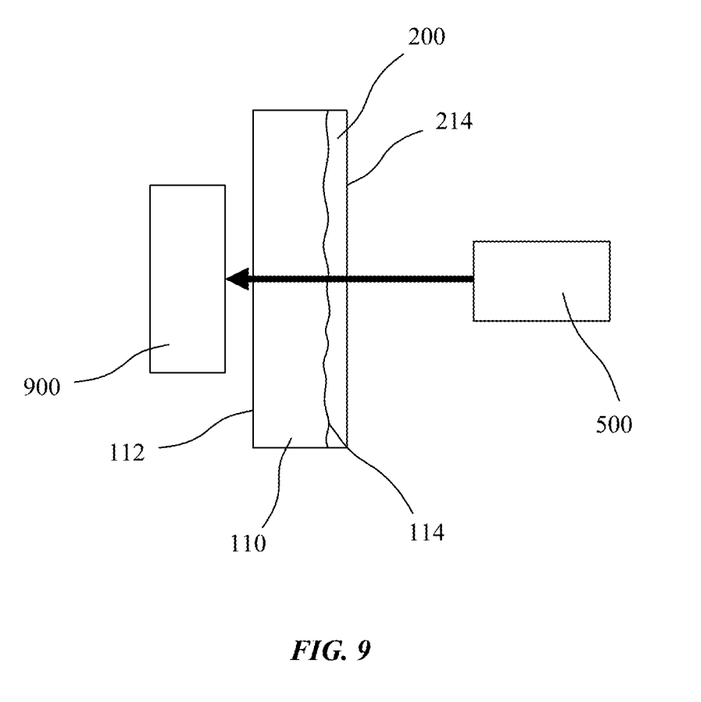
FIG. 9 is a schematic cross-sectional side view illustration of a laser transmission test in accordance with an embodiment.

Test Method 1:

In accordance with embodiments, laser transmission through the optical layer 200 and temporary substrate 110, or through the optical fluid 802 and temporary substrate 110 is greater than 80%, or more specifically greater than 90%. FIG. 9 is a schematic cross-sectional side view illustration of a laser transmission test in accordance with an embodiment incorporating an optical layer 200. As show, the back side 114 of the temporary substrate 110 is covered with an optical layer 200. A laser beam with wavelength of 248 nm, and power (Pin) is directed to the back surface 214 of the optical layer 200, and a detector (power meter) 900 is placed immediately close to the front side 112 (e.g. polished side) to measure the transmitted power (Pt). The transmission T=Pt/Pin. In accordance with embodiments, exemplary LLO laser operating conditions may include a KrF excimer laser, 248 nm wavelength, 100-150 Watts average power. However, the laser conditions are exemplary and embodiments are not limited to excimer lasers, specific laser wavelengths, or power ranges.

Test Method 2:

In accordance with embodiments, refractive index (n) and optical extinction coefficient (k) may be measured with spectroscopic ellipsometry. An incident laser at the LLO wavelength (e.g. 248 nm) is directed toward the back side 114 of a temporary substrate 110 covered with an optical layer 200 with known thickness at an oblique angle. The (n) and (k) of the optical layer 200 are derived from the reflectance (e.g. at least 70%) of polarized light. In an embodiment, an optical extinction coefficient (k) from 0 to 0.0005 and a refractive index (n) within +/−0.25 of a material from which the temporary substrate 110 is formed are measured for the optical layer 200.

The (n) and (k) of a material is derived from the reflectance of polarized light from the material stated as:

$$\rho = \tan \psi \cdot \exp i\Delta \quad (1)$$

where the relative amplitude ratio (ψ) and relative phase difference (Δ) of the orthogonal are measured. These values can be assumed to be equal in a 1:1 relationship with (n) and (k) for reflection at a single interface (e.g. bare substrate). The most common method to determine (n) and (k) values is to compare the values through a predictive model using regression analysis.

Material optical constants are calculated through an broad wavelength range, using a dispersion equation, described as Cauchy relationship:

$$n(\lambda) = A + \frac{B}{\lambda^2} + \frac{C}{\lambda^4} \quad (2)$$

This equation may determine an overall plot of optical constant shape vs. wavelength. The adjustable parameters of the dispersion relationship allow the overall optical constant shape to match the experimental results. Steps in analyzing ellipsometry results: 1) Construct a model of the target, in terms of the materials, if known. 2) Known materials will have a dispersion equation to represent (n) and (k) as a function of wavelength, of which there are many types. 3) If there are similar materials or models, use these as starting points in the fitting process. If the fit is good, (goodness of fit) than ensure the model is correct by checking how accurate (precision) the thickness of the film is compared to expected value. By using the calculated Cauchy relationship the (n) and (k) values can be calculated at a given wavelength.

Following separation of the temporary substrate 110, the temporary substrate 110 may be reclaimed, or reconditioned, for reuse. In an embodiment, following LLO, reclamation includes removal of the optical layer 200 (if present), and reconditioning of the front side 112 of the temporary substrate 110. For example, reconditioning of the front side 112 may include removal of a portion of the decomposed process layer 120, and polishing. In accordance with embodiments, it is not necessary to lap and polish the back side 114 of the temporary substrate 110 for LLO. Accordingly, the original thickness of the temporary substrate 110 is substantially retained after LLO, and the temporary substrate 110 may be reused.

In one embodiment, a method of reclaiming a temporary substrate 110 includes removal of metallic gallium from a front side 112 of the temporary substrate and polishing of the front side 112 of the temporary substrate. In an embodiment, the reclamation method additionally includes removal of an optical layer 200 from a back side 114 of the temporary substrate 110.

Test Experiment:

In order to demonstrate effectiveness of the optical layers described in accordance with embodiments, a qualitative test experiment was designed. In the experiment glass substrate was provided with an amorphous silicon topcoat. A total of six temporary substrate 110 test samples were prepared and placed onto the amorphous silicon topcoat, back side 114 up. In the case of a temporary substrate 110 including an optical layer 200, the back surface 214 was facing up. A laser source was then directed through the back side 114 of each temporary substrate 110 test sample and/or back surface 214 and toward the amorphous silicon topcoat underneath each temporary substrate 110. After application of the laser energy, the six test samples were removed from the glass substrate, and the amorphous silicon topcoat was imaged with a camera.

Testing was performed using both a 248 nm wavelength laser source as well as a 308 nm wavelength laser source. Testing was additionally performed at comparatively high, medium, and low laser intensities between 1,000-1,200 mJ/cm². The six samples were arranged into a first group tested at 248 nm wavelength (with high, medium, low laser intensities), and a second group tested at 308 nm wavelength (with high, medium, low laser intensities). Each group included a baseline sapphire ($Al_2O_3$) temporary substrate 110 with a polished back side 114, a baseline sapphire temporary substrate 110 with an unpolished back side 114 characterized by an average surface roughness (Ra) of about 0.75 μm, and a sapphire temporary substrate 110 with an unpolished back side 214 (Ra about 0.75 μm) and optical layer 200 with a back surface 214 characterized by an Ra of about 0.2 μm.

The two optical layers 200 each were formed of a polymer composition that was spin coated onto the unpolished back side 114 (Ra of about 0.75 μm) of a sapphire temporary substrate 110, with a dried optical layer 200 thickness of approximately 1-5 μm. The optical layers 200 were analyzed by spectroscopic ellipsometry according to test method #2 to determine optical extinction coefficient (k) and refractive index (n) as provided below in Table 1.

TABLE 1

Optical layer characterization

|   | Layer #1<br>for 248 nm laser | Layer #2<br>for 308 nm laser |
|---|---|---|
| k | ~0 | ~0 |
| n | 1.62 at 248 nm | 1.67 at 308 nm |

Figure 10:
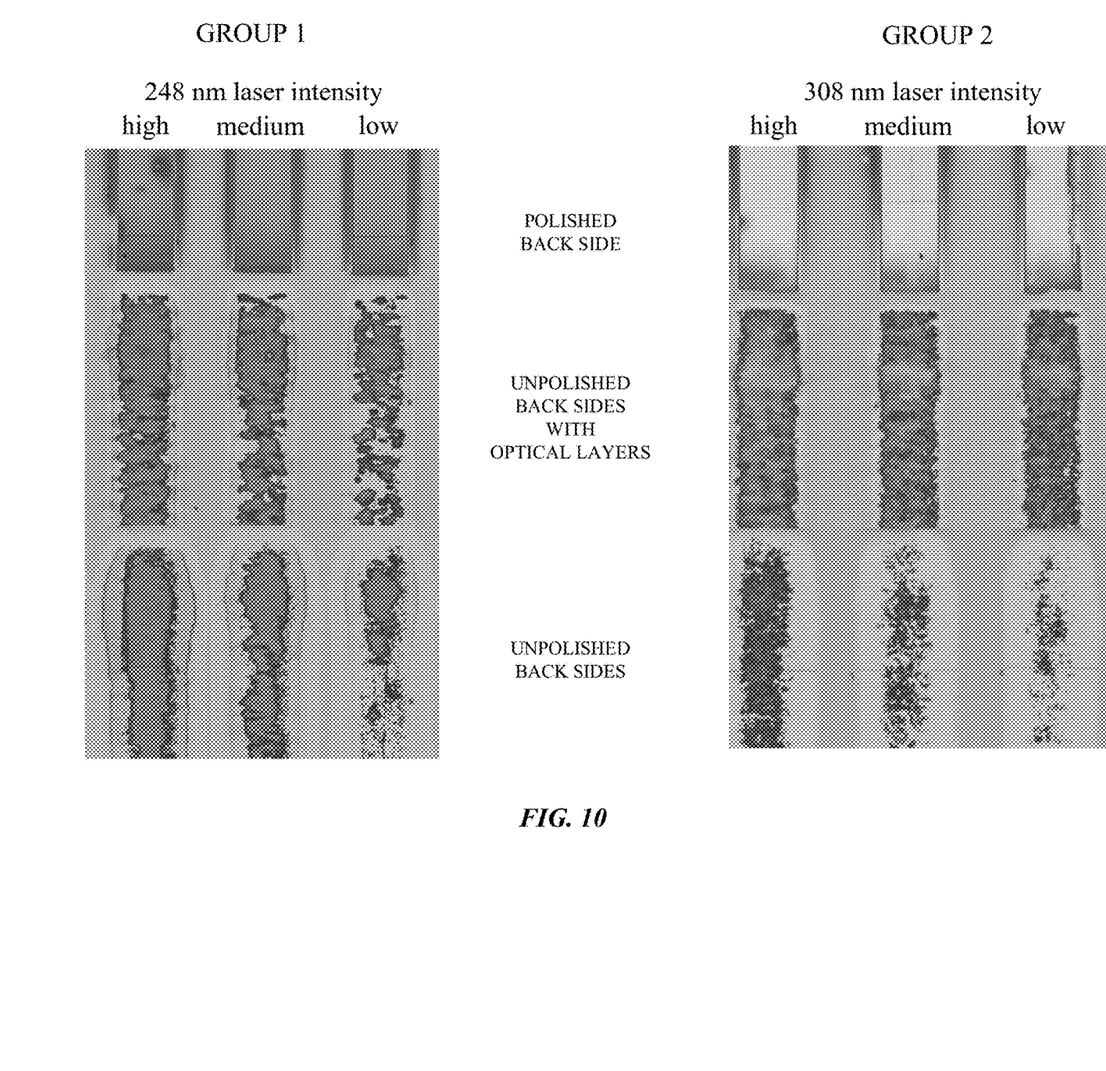
FIG. 10 illustrates an altered amorphous silicon topcoat layer due to light scattering in accordance with embodiments.

Referring now to FIG. 10, images of the altered amorphous silicon topcoat layers for group 1 and group 2 test samples are provided after removal of the six test samples. As shown, the laser energy directed through the polished back sides 114 resulted in a smooth image, which corresponds to low light scattering at the back side 114. Also shown, the test samples including optical layers 200 tested at 248 nm and 308 nm laser wavelengths demonstrated reduced light scattering compared to the test samples with unpolished back sides without an applied optical layer. Additionally, the test sample with an optical layer 200 tested at 308 nm laser wavelength was observed to result in less light scattering than the test sample with the optical layer 200 tested at 248 nm laser wavelength. It is believed this may potentially be attributed to a smaller refractive index difference from the sapphire temporary substrate 110 at the laser wavelength (1.83-1.62 @ 248 nm; 1.81-1.67 @ 308 nm), and/or use of a longer laser wavelength.

As observed from the results illustrated in FIG. 10, light scattering is believed to be a main contributor to transmission loss, and thus laser transmission % through the temporary substrate 110 that ultimately affects LLO results. Thus, the qualitative results provided in FIG. 10 demonstrate feasibility of the optical layers 200 in accordance with embodiments for improving LLO efficiency.

In utilizing the various aspects of the embodiments, it would become apparent to one skilled in the art that combinations or variations of the above embodiments are possible for providing an optically flat surface for laser lift-off. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A laser lift-off method comprising:
   forming an optical layer on a back side of a temporary substrate that supports a process layer on a front side of the temporary substrate;
   wherein the optical layer is characterized by:
      a front surface on the back side of the temporary substrate;
      an index of refraction within +/−0.25 of the temporary substrate at an operational wavelength; and
      a back surface;
   directing a laser at the operational wavelength through the optical layer and the temporary substrate to decompose the process layer; and
   separating the process layer and the temporary substrate.

2. The laser lift-off method of claim 1, wherein the back side of the temporary substrate has an average surface roughness (Ra) that is greater than an average surface roughness of the back surface of the optical layer.

3. The laser lift-off method of claim 2, wherein the optical layer has an optical extinction coefficient (k) from 0 to 0.0005 at the operational wavelength.

4. The laser lift-off method of claim 3, wherein the back surface of the optical layer has an average surface roughness (Ra) of less than 5 nm.

5. The laser lift-off method of claim 4, wherein the process layer comprises a p-n diode.

6. The laser lift-off method of claim 5, wherein the temporary substrate is a single side polished (SSP) wafer.

7. The laser lift-off method of claim 3, wherein the process layer and the temporary substrate comprise a heteroepitaxial or homoepitaxial system.

8. The method of claim 1, further comprising polishing the front side of the temporary substrate after separating the process layer and reclaiming the temporary substrate.

9. The method of claim 8, wherein the operational wavelength is within 190 to 400 nm.

10. The method of claim 1, further comprising operating the laser at 10 to 300 Watts, during directing the laser through the optical layer and the temporary substrate to decompose the process layer.

11. The method of claim 1, wherein greater than 90% of photon energy from the laser is directed through the optical layer and the temporary substrate.

12. A laser lift-off method comprising:
   immersing a substrate stack in an optical liquid, wherein the substrate stack includes a temporary substrate that supports a process layer on a front side of the temporary substrate, and wherein the optical liquid has an index of refraction within +/−0.25 of an index of refraction of the temporary substrate at an operational wavelength;
   directing a laser at the operational wavelength through the optical liquid and the temporary substrate to decompose the process layer; and
   separating the process layer and the temporary substrate.

13. The laser lift-off method of claim 12, wherein the back side of the temporary substrate has an unpolished back side.

14. The laser lift-off method of claim 13, wherein the temporary substrate is a single side polished (SSP) wafer.

15. The laser lift-off method of claim 12, wherein the process layer and the temporary substrate comprise a heteroepitaxial or homoepitaxial system.

16. The laser lift-off method of claim 15, wherein the process layer comprises a p-n diode.

17. The method of claim 12, further comprising polishing the front side of the temporary substrate after separating the process layer and the temporary substrate.

18. The method of claim 12, further comprising operating the laser at 10 to 300 Watts during directing the laser through the optical layer and the temporary substrate to decompose the process layer.

19. The method of claim 18, wherein the operational wavelength is within 190 to 400 nm.

20. The method of claim 12, wherein greater than 90% of photon energy from the laser is directed through the optical fluid and the temporary substrate.

21. A laser lift-off method comprising:
   forming an optical layer on a back side of a temporary substrate that supports a process layer on a front side of the temporary substrate;
   wherein the optical layer is includes a back surface, and a front surface on the back side of the temporary substrate, and the back side of the temporary substrate has an average surface roughness (Ra) that is greater than an average surface roughness of the back surface of the optical layer;

directing a laser at an operational wavelength through the optical layer and the temporary substrate to decompose the process layer; and separating the process layer and the temporary substrate.

22. The laser lift-off method of claim 21, wherein the back surface of the optical layer has an average surface roughness (Ra) of less than 5 nm.

23. The laser lift-off method of claim 21, wherein the process layer comprises a p-n diode.

24. The laser lift-off method of claim 21, wherein the temporary substrate is a single side polished (SSP) wafer.

25. The method of claim 21, further comprising polishing the front side of the temporary substrate after separating the process layer and the temporary substrate.

* * * * *